(12) United States Patent
Zou et al.

(10) Patent No.: US 10,020,293 B2
(45) Date of Patent: Jul. 10, 2018

(54) TRANSFERRING METHOD, MANUFACTURING METHOD, DEVICE AND ELECTRONIC APPARATUS OF MICRO-LED

(71) Applicant: Goertek.Inc, Shandong (CN)

(72) Inventors: Quanbo Zou, Shandong (CN); Zhe Wang, Shandong (CN)

(73) Assignee: GoerTek Inc., Weifang—Shandong (CN)

( * ) Notice: Subject to any disclaimer, the term of this patent is extended or adjusted under 35 U.S.C. 154(b) by 0 days.

(21) Appl. No.: 15/529,612

(22) PCT Filed: Apr. 1, 2015

(86) PCT No.: PCT/CN2015/075642
§ 371 (c)(1),
(2) Date: May 25, 2017

(87) PCT Pub. No.: WO2016/154956
PCT Pub. Date: Oct. 6, 2016

(65) Prior Publication Data
US 2017/0263593 A1 Sep. 14, 2017

(51) Int. Cl.
| | | |
|---|---|---|
| *H01L 25/075* | (2006.01) | |
| *H01L 33/00* | (2010.01) | |
| *H01L 33/62* | (2010.01) | |

(52) U.S. Cl.
CPC ...... *H01L 25/0753* (2013.01); *H01L 33/0079* (2013.01); *H01L 33/0095* (2013.01); *H01L 33/62* (2013.01); *H01L 2933/0066* (2013.01)

(58) Field of Classification Search
CPC . H01L 25/0753; H01L 33/62; H01L 33/0079; H01L 33/0095; H01L 2933/0066; H01L 27/156; H01L 25/167; H01L 25/50; H01L 21/6835; H01L 2924/12041; H01L 2924/181; H01L 2221/68354; H01L 21/568; H01L 2221/68318; H01L 2224/96; H01L 2933/005; H01L 33/58; H01L 2221/68363; H01L 27/1292;
(Continued)

(56) References Cited

U.S. PATENT DOCUMENTS

| | | |
|---|---|---|
| 7,202,141 B2 | 4/2007 | Park et al. |
| 8,333,860 B1 | 12/2012 | Bibl et al. |

(Continued)

FOREIGN PATENT DOCUMENTS

| | | |
|---|---|---|
| CN | 1973375 A | 5/2007 |
| CN | 101281948 A | 10/2008 |

OTHER PUBLICATIONS

International Searching Authority, International Search Report and Written Opinion for International Application No. PCT/CN2015/075642, dated Jan. 8, 2016, 6 pages, State Intellectual Property Office of the P.R.C., China.

*Primary Examiner* — Caleen Sullivan
(74) *Attorney, Agent, or Firm* — Alston & Bird LLP

(57) ABSTRACT

The present invention discloses a transferring method, a manufacturing method, a device and an electronic apparatus of micro-LED. The method for transferring micro-LED comprises: forming a micro-LED on a laser-transparent original substrate; bringing the micro-LED into contact with a pad preset on a receiving substrate; and irradiating the original substrate with laser from the original substrate side to lift-off the micro-LED from the original substrate.

12 Claims, 4 Drawing Sheets

(58) Field of Classification Search
CPC ........... H01L 27/14683; H01L 21/7806; H01L 2224/81815; H01L 33/24; H01L 2224/03; H01L 2224/04105; H01L 2224/80006; G09G 3/32; F21Y 2115/10; G02B 6/43; H05B 33/10; H05K 1/0306; H05K 1/181; H05K 2201/10106; B41F 16/00; Y10S 438/977; B81C 2201/0185
USPC .......................................................... 438/28
See application file for complete search history.

(56) References Cited

U.S. PATENT DOCUMENTS

| | | |
|---|---|---|
| 8,426,227 B1 | 4/2013 | Bibl et al. |
| 2013/0285086 A1 | 10/2013 | Hu et al. |
| 2014/0094878 A1* | 4/2014 | Gossler ............... A61N 5/0622 607/88 |

* cited by examiner

TRANSFERRING METHOD, MANUFACTURING METHOD, DEVICE AND ELECTRONIC APPARATUS OF MICRO-LED

CROSS REFERENCE TO RELATED APPLICATIONS

This application is a National Stage Application, filed under 35 U.S.C. § 371, of International Application No. PCT/CN2015/075642, filed Apr. 1, 2015; the contents of which as are hereby incorporated by reference in their entirety.

BACKGROUND

Related Field

The present invention relates to Micro-Light Emitting Diode (micro LED) array for display, and in particular, to a method for transferring micro-LED, a method for manufacturing a micro-LED device, a micro-LED device and an electronic apparatus containing a micro-LED device.

Description of Related Art

The micro-LED technology refers to the LED array of small size integrated on a substrate with high density. Currently, the micro-LED technology is starting development, and it is expected in the industry that a high-quality micro-LED product comes into the market. High-quality micro-LED will have a deep affection on the conventional display products such as LCD/OLED that have already been put into the market.

In the process of manufacturing micro-LEDs, micro-LEDs are first formed on a donor wafer, and then the micro-LEDs are transferred to a receiving substrate. The receiving substrate is a display screen, for example.

One difficulty during manufacturing a micro-LED lies in how to transfer a micro-LED from a donor wafer to a receiving substrate. In the prior art, the transfer is generally performed by means of electrostatic pick-up. A transfer head array will be needed during the electrostatic pick-up. The structure of the transfer head array is relatively complicated, and the stability thereof shall be considered. An extra cost shall be paid for manufacturing a transfer head array. A phase change shall be made before pick-up with the transfer head array. In addition, during manufacturing with a transfer head array, limitations apply to the thermo budget of a micro-LED for phase change, which is generally lower than 350° C., or more specifically, lower than 200° C.; otherwise, the performance of the micro-LED will be degraded. It generally requires two transfers during the manufacturing with transfer head array, i.e., the transfer from a donor wafer to a carrier wafer and the transfer from the carrier wafer to a receiving substrate.

U.S. Pat. No. 8,333,860B1 discloses an array of transfer heads for transferring micro devices, in which a voltage is applied to the electrode in the transfer head to pick-up a micro device. This patent is fully incorporated hereby as reference herein.

U.S. Pat. No. 8,426,227B1 discloses a method of forming a micro light emitting diode array, in which a micro-LED array is transferred to a receiving substrate by using a transfer head array. This patent is fully incorporated hereby as reference herein.

BRIEF SUMMARY

One object of this invention is to provide a new technical solution for transferring a micro-LED.

According to an embodiment of the present invention, there is provided a method for transferring a micro-LED, comprising: forming a micro-LED on a laser-transparent original substrate; bringing the micro-LED into contact with a pad preset on a receiving substrate; and irradiating the original substrate with laser from the original substrate side to lift-off the micro-LED from the original substrate.

Preferably, the step of forming a micro-LED on a laser-transparent original substrate comprises forming a plurality of micro-LEDs on the laser-transparent original substrate. Preferably, the step of bringing the micro-LED into contact with a pad preset on a receiving substrate comprises bringing at least one micro-LED of the plurality of micro-LEDs into contact with at least one pad preset on the receiving substrate. Preferably, the step of irradiating the original substrate with laser from the original substrate side to lift-off the micro-LED from the original substrate comprises irradiating at least one area on the original substrate with laser from the original substrate side to lift-off the at least one micro-LED from the original substrate.

Preferably, the step of forming a micro-LED on a laser-transparent original substrate further comprises singulating the plurality of micro-LEDs, for example before transferring.

Preferably, the step of bringing the micro-LED into contact with a pad preset on a receiving substrate comprises: bringing the micro-LED into contact with a pad preset on a receiving substrate via liquid thin film. Preferably, the liquid thin film includes flux.

Preferably, the method further comprises: reflow soldering the lifted-off micro-LED on the receiving substrate; and depositing negative electrode on the micro-LED.

Preferably, the method further comprises: filling the soldered micro-LED with polymer.

Preferably, the method further comprises: offsetting the original substrate for transferring additional micro-LEDs.

Preferably, the method further comprises: forming a micro-LED on an additional laser-transparent backup substrate; bringing the micro-LED on the backup substrate into contact with a pad preset on a receiving substrate; and irradiating the backup substrate with laser from the backup substrate side to lift-off the micro-LED from the backup substrate. Alternatively, this backup substrate (e.g., partial wafer) can be from the original substrate which is singulated. For example, the micro-LED on the backup substrate can be of the same color.

Preferably, the pad is set for red pixel array, yellow pixel array or blue pixel array.

Preferably, the receiving substrate is a display screen panel.

According to another embodiment of the present invention, there is provided a method for manufacturing a micro-LED device, comprising transferring a micro-LED to a receiving substrate by using the method for transferring a micro-LED according to the present invention.

According to another embodiment of the present invention, there is provided a micro-LED device, which is manufactured by using the method for manufacturing a micro-LED device according to the present invention.

According to another embodiment of the present invention, there is provided an electronic apparatus, containing a micro-LED device according to the present invention.

The inventors of the present invention have found that, in the prior art, the approach of electrostatic pick-up is used in the process of manufacturing a micro-LED array to transfer a micro-LED from a donor wafer to a receiving substrate. However, in the present invention, a micro-LED (array) is formed on the original substrate, and then the micro-LED is directly transferred to a receiving substrate by means of laser lift-off. So, the task to be implemented by or the technical problem to be solved by the present invention has not been conceived or anticipated by a person skilled in the art and thus the present invention is a new solution.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
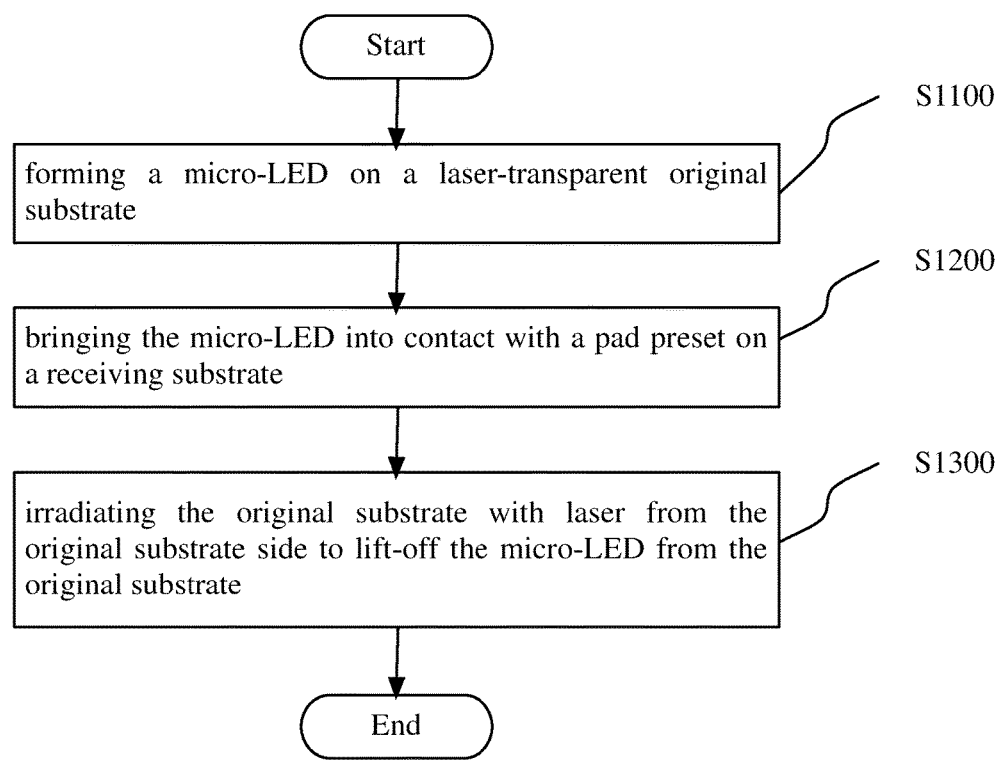
FIG. 1 shows a flow chart of an illustrative embodiment of the method according to the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

FIG. 1 shows a flow chart of an illustrative embodiment of the method for transfer micro-LED according to the present invention.

As shown in FIG. 1, at step S1100, a micro-LED is formed on a laser-transparent original substrate.

The laser-transparent original substrate can be a sapphire substrate, SiC substrate and so on, for example. The micro-LED can be used for being mounted on a display screen panel.

It should be understood by a person skilled in the art that one micro-LED could be formed on the original substrate, or a plurality of micro-LED could be formed on the original substrate. For example, a plurality of micro-LEDs can be formed on the laser-transparent original substrate. The plurality of micro-LEDs can form an array.

In an example, in a case where a plurality of micro-LEDs are formed on the laser-transparent original substrate, the original substrate can be singulated or divided into multiple pieces for more flexible transferring.

At step S1200, the micro-LED is brought into contact with a pad preset on a receiving substrate.

For example, the receiving substrate is a display screen panel.

For example, the pad can be set for red pixel array, yellow pixel array or blue pixel array.

In an example, in a case where a plurality of micro-LED are formed, at least one micro-LED of the plurality of micro-LEDs can be brought into contact with at least one pad preset on the receiving substrate. The at least one micro-LED could be one, several or all of the plurality of micro-LEDs. It should be understood by a person skilled in the art that, although it is just described here that at least one micro-LED, which is expected to be lifted-off, is in contact with a pad, a remaining micro-LED of the plurality of micro-LEDs can also be in contact with a pad.

For example, in the step of contact (S1200), the micro-LED can be brought into contact with the pad preset on the receiving substrate via a liquid thin film. For example, the liquid thin film can include flux. Herein, the lift-off of a micro-LED will be easy through the surface tension force of the liquid thin film (flux), and the successful rate is high.

At step S1300, the original substrate is irradiated with laser from the original substrate side to lift-off the micro-LED from the original substrate.

In an example, in a case where at least one micro-LED is in contact with pad, at least one area on the original substrate can be irradiated with laser from the original substrate side to lift-off the at least one micro-LED from the original substrate. For example, a technician can select the at least one area. For example, the at least one area corresponds to the at least micro-LED, respectively. The at least one area can be just partial area on the original substrate, or can be the whole area.

In another example, the original substrate can be offset for transferring additional micro-LEDs.

In another example, after the transferring using the original substrate, an additional laser-transparent backup substrate can be used to cope with a situation in which micro-LEDs are missing at some points on the display screen panel. For example, a micro-LED can be formed on an additional laser-transparent backup substrate; the micro-LED on the backup substrate is brought into contact with a pad preset on a receiving substrate; and the backup substrate is irradiated with laser from the backup substrate side to lift-off the micro-LED from the backup substrate. In such a way, the quality of a display screen can further be improved.

An array of micro-LEDs can be formed on the receiving substrate after the transferring of micro-LEDs to the receiving substrate.

After the transferring of micro-LEDs to the receiving substrate, the present invention can further include subsequent steps.

For example, the lifted-off micro-LEDs can be reflow-soldered on the receiving substrate. A negative electrode can be deposited on the micro-LEDs. The reflow-soldering can be performed after micro-LEDs of each color are transferred. Alternatively, the reflow-soldering can be performed after micro-LEDs of all colors are transferred.

In addition, the soldered micro-LED can be filled with polymer. For example, a confocal dielectric deposition can be used in stead of polymer filling.

In another embodiment, the present invention further includes a method for manufacturing a micro-LED device. The manufacturing method comprises transferring a micro-LED to a receiving substrate by using the method for transferring a micro-LED according to the present invention.

In another embodiment, the present invention further includes a micro-LED device, such as a display screen device. The micro-LED device can be manufactured by using the method for manufacturing a micro-LED device according to the present invention.

In comparison with the prior art, under the similar conditions, the micro-LED manufactured by using the solution of the present invention is relatively simple and reliable while maintaining a high quality, and the through put thereof is relatively high with low cost.

In another embodiment, the present invention further includes an electronic apparatus. The electronic apparatus contains a micro-LED device according to the present invention. For example, the electronic apparatus can be a mobile phone, a pad computer and so on.

In the solution of the present invention, a micro-LED is formed directly on the original substrate and it is transferred to a receiving substrate by means of laser lift-off. The solution of this invention have not been conceived by the prior art.

In addition, the micro-LED can be selectively transferred through the present invention.

In addition, in the solution of the present invention, the transfer can be performed only once while two transfers are needed in the prior art.

In addition, in comparison with the prior art, the solution of the present invention is relatively efficient, the cost is relatively low and product performance degrade due to an extra thermal budget will not occur.

In addition, in comparison with the prior art using a pick-up head, the present invention does not need a complicated pick-up system, and thus the cost of product manufactured using the present invention will relatively low and reliable.

In addition, since it does not need the temporary bonding in the prior art between the micro-LED and the intermediate carrier substrate, the cost can be further decreased by this invention.

Since it is not necessary to consider the phase change of bonding layer considered in the prior art using pick-up head, the manufacturing method of the present invention can have a relatively high through put and the extra thermal load limitation will be less. Consequently, under the similar conditions, the manufactured micro-LED will have a higher performance.

An example for transferring a micro-LED according to the present invention will be described below with reference to FIGS. 2A to 2G.

Figure 2A:
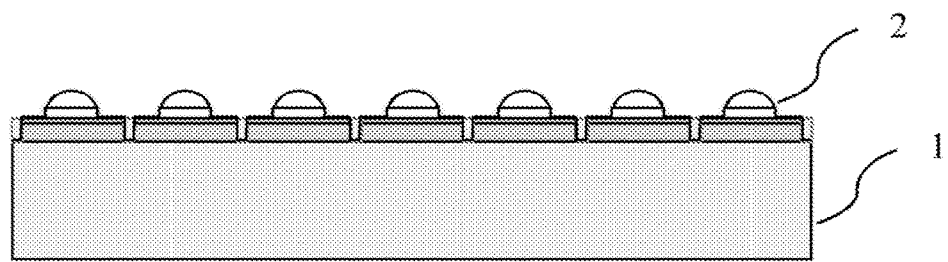
FIG. 2A to 2G shows an example for transferring a micro-LED according to the present invention.

As shown in FIG. 2A, micro-LEDs 2 are formed on a laser-transparent original substrate 1 such as sapphire substrate. The micro-LEDs 2 have a vertical micro-LED structure, for example. The micro-LEDs 2 contains, for example, a n-doped GaN layer, a multiple quantum well structure, a p-doped GaN layer, a p metal electrode, a bump, and so on.

As shown in FIG. 2A, the plurality of micro-LEDs 2 can be singulated.

Figure 2B:
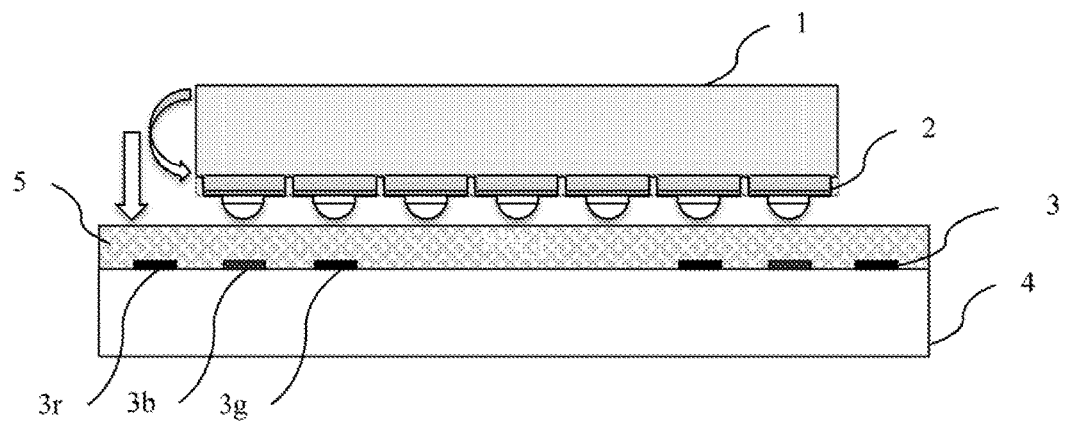

As shown in FIG. 2B, the original substrate 1 is flipped over, and is aligned with a receiving substrate 4 with liquid thin film (for example, containing flux) 5. The micro bumps on the micro-LEDs are in contact with the flux. Pads 3 are preset on the receiving substrate 4. For example, the pads 3 include pad 3r for receiving red micro-LED, pad 3b for receiving blue micro-LED and pad 3g for receiving green micro-LED.

Figure 2C:
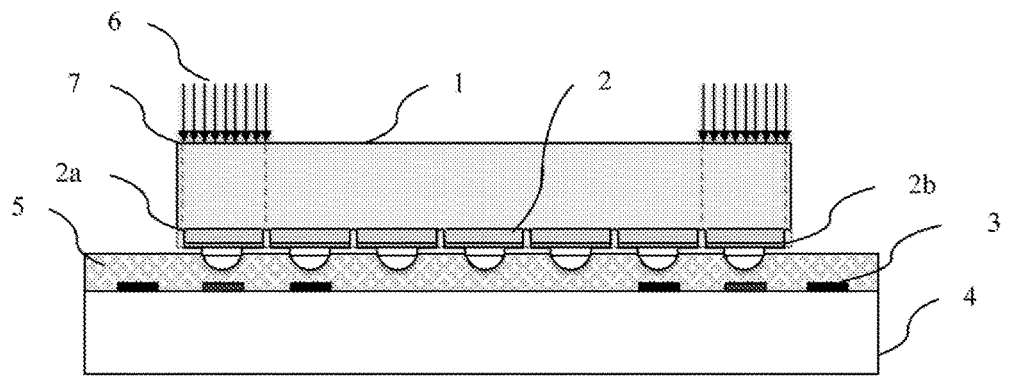

As shown in FIG. 2C, partial areas 7 on the original substrate are selectively irradiated with laser 7, to lift off the selected micro-LEDs 2a, 2b of the plurality of formed micro-LEDs from the original substrate.

Figure 2D:
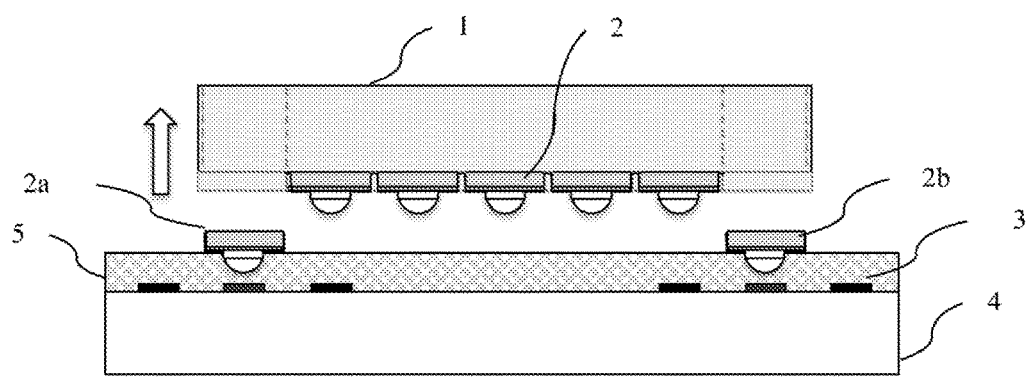

As shown in FIG. 2D, the original substrate 1 is lifted up. Because of the function of the surface tension force of the liquid thin film, the selected micro-LEDs 2a, 2b are lifted-off easily, while the other micro-LEDs are remained on the original substrate 1.

Then, the original substrate is moved and the operations of FIGS. 2C to 2D are repeated, so that a plurality of micro-LEDs are transferred to the receiving substrate.

Figure 2E:
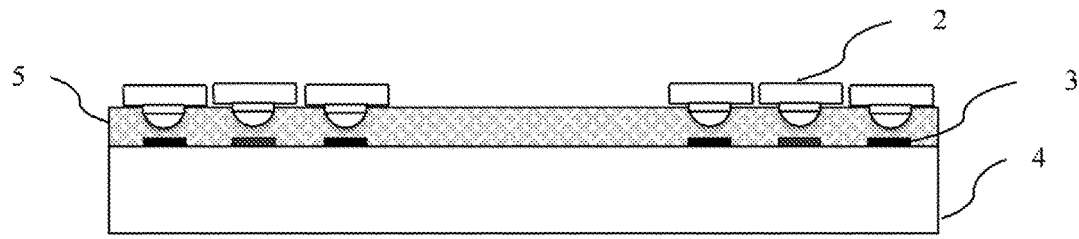

As shown in FIG. 2E, the plurality of micro-LEDs are transferred to the receiving substrate 4.

Figure 2F:
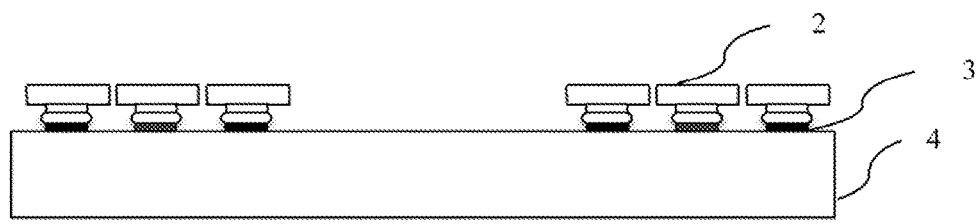

As shown in FIG. 2F, for example, the plurality of micro-LEDs are soldered onto the receiving substrate through reflow soldering. Then, the flux is cleaned.

Figure 2G:
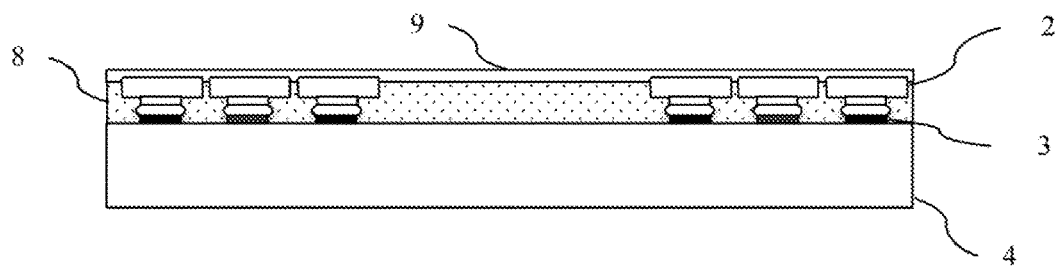

As shown in FIG. 2G, the receiving substrate is filled with polymer 8 and is sealed. Then, n-metal electrode 9 is deposited, for example, using ITO material.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for transferring micro-LED, the method comprising the steps of:
   forming a plurality of micro-LEDs on a laser-transparent original substrate;
   bringing at least one micro-LED of the plurality of micro-LEDs into contact with at least one pad preset on a receiving substrate via liquid thin film; and
   selectively irradiating at least one area on the original substrate with laser from the original substrate side to selectively lift-off the at least one micro-LED from the original substrate.

2. The method according to claim 1, wherein the step of forming a plurality of micro-LEDs on a laser-transparent original substrate further comprises singulating the original substrate.

3. The method according to claim 1, wherein the liquid thin film includes flux.

4. The method according to claim 1, further comprising the steps of:
   reflow soldering the lifted-off at least one micro-LED on the receiving substrate; and
   depositing negative electrode on the soldered micro-LED.

5. The method according to claim 4, further comprising the step of filling the soldered micro-LED with polymer.

6. The method according to claim 1, further comprising the step of offsetting the original substrate for transferring additional micro-LEDs.

7. The method according to claim 1, further comprising the steps of:

forming a micro-LED on an additional laser-transparent backup substrate;

bringing the micro-LED on the backup substrate into contact with a pad preset on a receiving substrate; and irradiating the backup substrate with laser from the backup substrate side to lift-off the micro-LED from the backup substrate.

8. The method according to claim 1, wherein the pad is set for at least one of red pixel array, yellow pixel array, or blue pixel array.

9. The method according to claim 1, wherein the receiving substrate is a display screen panel.

10. A method for manufacturing a micro-LED device, the method comprising the step of transferring micro-LEDs to a receiving substrate by using the method according to claim 1.

11. A micro-LED device manufactured by using the method according to claim 10.

12. An electronic apparatus, containing a micro-LED device according to claim 11.

* * * * *